(12) United States Patent
Sipani et al.

(10) Patent No.: US 9,741,580 B2
(45) Date of Patent: Aug. 22, 2017

(54) SUBSTRATE MASK PATTERNS, METHODS OF FORMING A STRUCTURE ON A SUBSTRATE, METHODS OF FORMING A SQUARE LATTICE PATTERN FROM AN OBLIQUE LATTICE PATTERN, AND METHODS OF FORMING A PATTERN ON A SUBSTRATE

(71) Applicant: Micron Technology, Inc., Boise, ID (US)

(72) Inventors: Vishal Sipani, Boise, ID (US); Anton J. deVilliers, Clifton Park, NY (US); William R. Brown, Boise, ID (US); Shane J. Trapp, Boise, ID (US); Ranjan Khurana, Boise, ID (US); Kevin R. Shea, Boise, ID (US)

(73) Assignee: Micron Technology, Inc., Boise, ID (US)

(*) Notice: Subject to any disclaimer, the term of this patent is extended or adjusted under 35 U.S.C. 154(b) by 127 days.

(21) Appl. No.: 14/674,476

(22) Filed: Mar. 31, 2015

(65) Prior Publication Data

US 2015/0206760 A1 Jul. 23, 2015

Related U.S. Application Data

(62) Division of application No. 13/712,806, filed on Dec. 12, 2012, now Pat. No. 8,999,852.

(51) Int. Cl.
*H01L 29/76* (2006.01)
*H01L 21/308* (2006.01)
(Continued)

(52) U.S. Cl.
CPC ........ *H01L 21/308* (2013.01); *H01L 21/0273* (2013.01); *H01L 21/02642* (2013.01);
(Continued)

(58) Field of Classification Search
CPC ........... H01L 21/02642; H01L 21/0273; H01L 21/0337; H01L 21/22; H01L 21/266;
(Continued)

(56) References Cited

U.S. PATENT DOCUMENTS 5,824,587 A 10/1998 Krivokapic
6,362,057 B1 3/2002 Taylor et al.
(Continued)

FOREIGN PATENT DOCUMENTS

WO WO 2009/126491 10/2009

OTHER PUBLICATIONS

U.S. Appl. No. 13/355,407, filed Jan. 20, 2012, Doebler.
(Continued)

*Primary Examiner* — Lan Vinh
(74) *Attorney, Agent, or Firm* — Wells St. John, P.S.

(57) ABSTRACT

A method of forming a pattern on a substrate comprises forming spaced, upwardly-open, cylinder-like structures projecting longitudinally outward of a base. Sidewall lining is formed over inner and over outer sidewalls of the cylinder-like structures, and that forms interstitial spaces laterally outward of the cylinder-like structures. The interstitial spaces are individually surrounded by longitudinally-contacting sidewall linings that are over outer sidewalls of four of the cylinder-like structures. Other embodiments are disclosed, including structure independent of method.

21 Claims, 6 Drawing Sheets

(51) Int. Cl.
  *H01L 21/027* (2006.01)
  *H01L 21/033* (2006.01)
  *H01L 21/311* (2006.01)
  *H01L 21/22* (2006.01)
  *H01L 21/266* (2006.01)
  *H01L 21/32* (2006.01)
  *H01L 21/768* (2006.01)
  *H01L 21/02* (2006.01)

(52) U.S. Cl.
  CPC .......... *H01L 21/0337* (2013.01); *H01L 21/22* (2013.01); *H01L 21/266* (2013.01); *H01L 21/31138* (2013.01); *H01L 21/31144* (2013.01); *H01L 21/32* (2013.01); *H01L 21/76816* (2013.01)

(58) Field of Classification Search
  CPC ............... H01L 21/32; H01L 21/31138; H01L 21/31144; H01L 21/32139
  USPC ........ 257/288, 296, 329, 331, 619; 438/299, 438/619, 717, 723, 758
  See application file for complete search history.

(56) References Cited

U.S. PATENT DOCUMENTS

| | | | |
|---|---|---|---|
| 6,403,431 B1 | 6/2002 | Chung et al. | |
| 6,521,543 B2 | 2/2003 | Lien | |
| 7,175,944 B2 | 2/2007 | Yin et al. | |
| 7,786,015 B2 | 8/2010 | Chen et al. | |
| 7,790,360 B2 | 9/2010 | Alapati et al. | |
| 7,820,553 B2 | 10/2010 | Chu et al. | |
| 7,915,171 B2 | 3/2011 | Wallace et al. | |
| 7,981,736 B2 * | 7/2011 | Juengling | H01L 27/10826 257/288 |
| 8,026,172 B2 | 9/2011 | Wang et al. | |
| 8,039,399 B2 | 10/2011 | Niroomand et al. | |
| 8,080,443 B2 | 12/2011 | Chen et al. | |
| 8,211,803 B2 | 7/2012 | Sandhu et al. | |
| 8,266,558 B2 | 9/2012 | Wells | |
| 2006/0011947 A1 | 1/2006 | Juengling | |
| 2006/0134448 A1 | 6/2006 | Daniel et al. | |
| 2006/0231900 A1 | 10/2006 | Lee et al. | |
| 2007/0281219 A1 | 12/2007 | Sandhu | |
| 2008/0012056 A1 | 1/2008 | Gonzales | |
| 2008/0113483 A1 | 5/2008 | Wells | |
| 2008/0254637 A1 | 10/2008 | Hanson et al. | |
| 2008/0280444 A1 | 11/2008 | Jung | |
| 2009/0068842 A1 | 3/2009 | Kim | |
| 2009/0166723 A1 * | 7/2009 | Sung | H01L 27/10876 257/328 |
| 2010/0167520 A1 | 7/2010 | Chen et al. | |
| 2010/0170868 A1 | 7/2010 | Lin et al. | |
| 2010/0216307 A1 | 8/2010 | Niroomand et al. | |
| 2010/0219466 A1 * | 9/2010 | Sung | H01L 27/10891 257/329 |
| 2010/0221919 A1 | 9/2010 | Lee et al. | |
| 2010/0240221 A1 | 9/2010 | Kim et al. | |
| 2010/0258966 A1 | 10/2010 | Sandhu | |
| 2011/0117719 A1 | 5/2011 | Brown et al. | |
| 2011/0129991 A1 | 6/2011 | Armstrong et al. | |
| 2011/0163420 A1 | 7/2011 | Valdivia et al. | |
| 2011/0183269 A1 | 7/2011 | Zhu | |
| 2011/0312184 A1 | 12/2011 | Lee et al. | |
| 2012/0028476 A1 | 2/2012 | Li et al. | |
| 2012/0273131 A1 | 11/2012 | Wells | |
| 2012/0312151 A1 | 12/2012 | Patel | |
| 2012/0313151 A1 | 12/2012 | Lee | |
| 2013/0295772 A1 | 11/2013 | Kim et al. | |
| 2014/0162457 A1 | 6/2014 | Sipani et al. | |
| 2014/0162458 A1 | 6/2014 | Khurana et al. | |
| 2014/0162459 A1 | 6/2014 | Trapp et al. | |

OTHER PUBLICATIONS

U.S. Appl. No. 13/712,820, filed Dec. 12, 2012, Khurana et al.
U.S. Appl. No. 13/712,830, filed Dec. 12, 2012, Trapp et al.
U.S. Appl. No. 13/786,848, filed Mar. 6, 2013, Sipani et al.
Chapter 2: Crystal Structures and Symmetry; Laue, B; Dec. 28, 2001; 4pp.

* cited by examiner

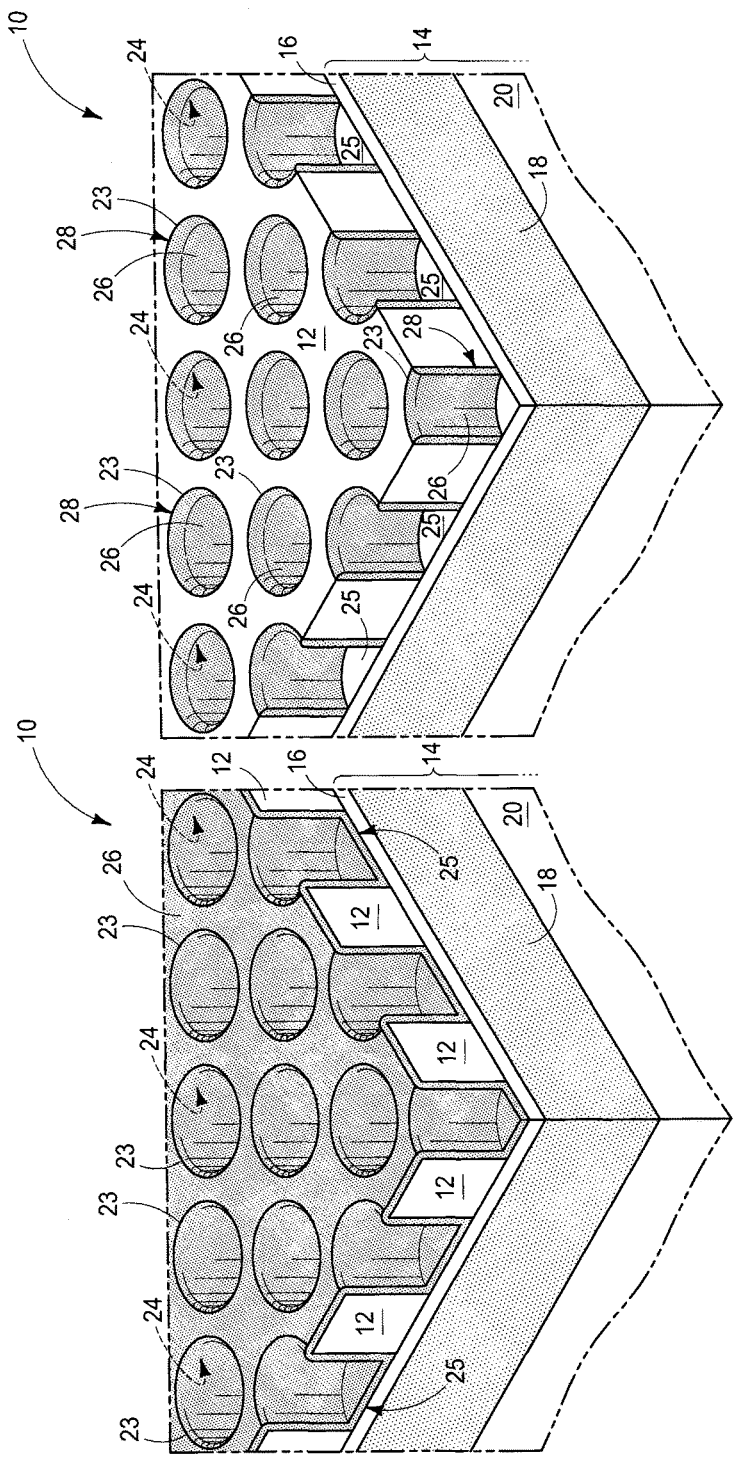

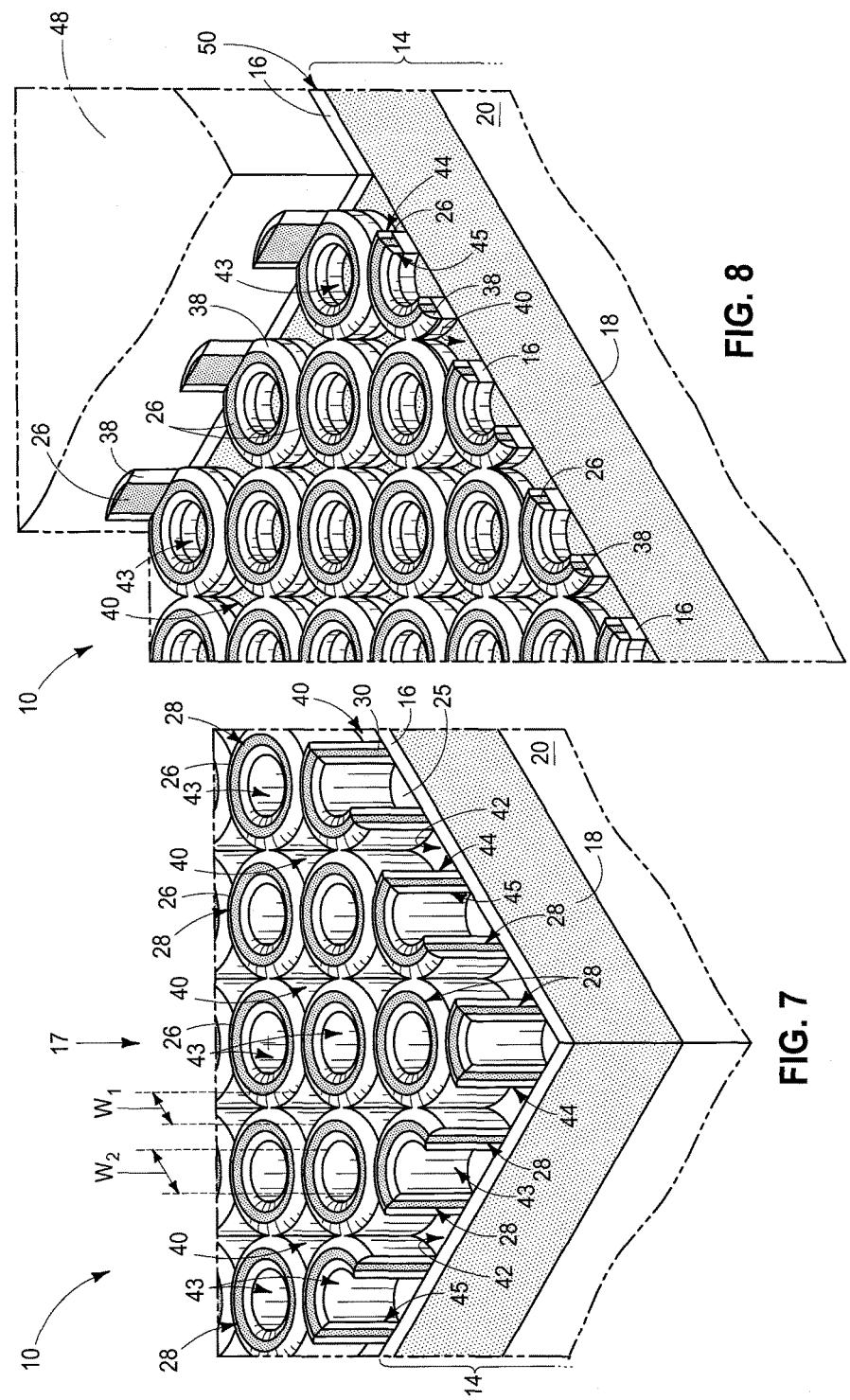

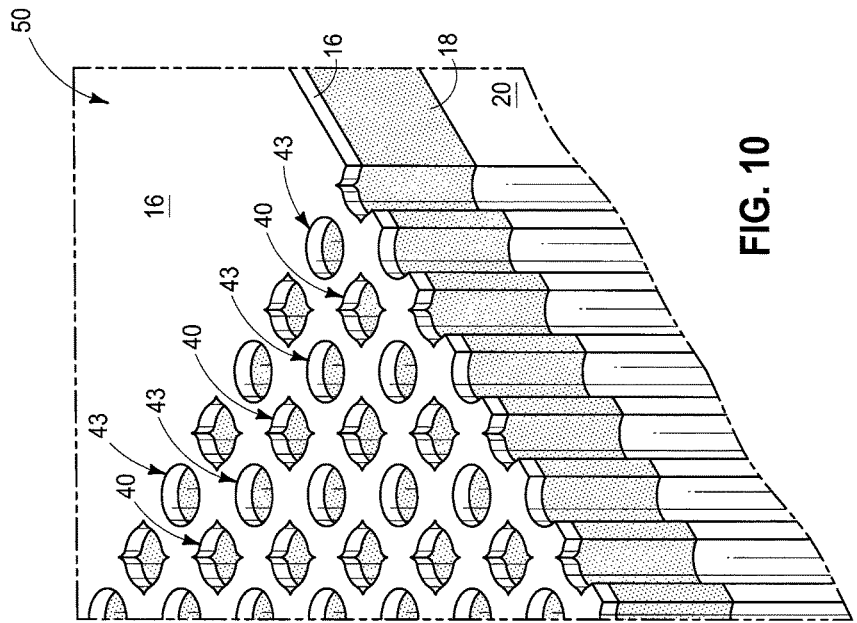
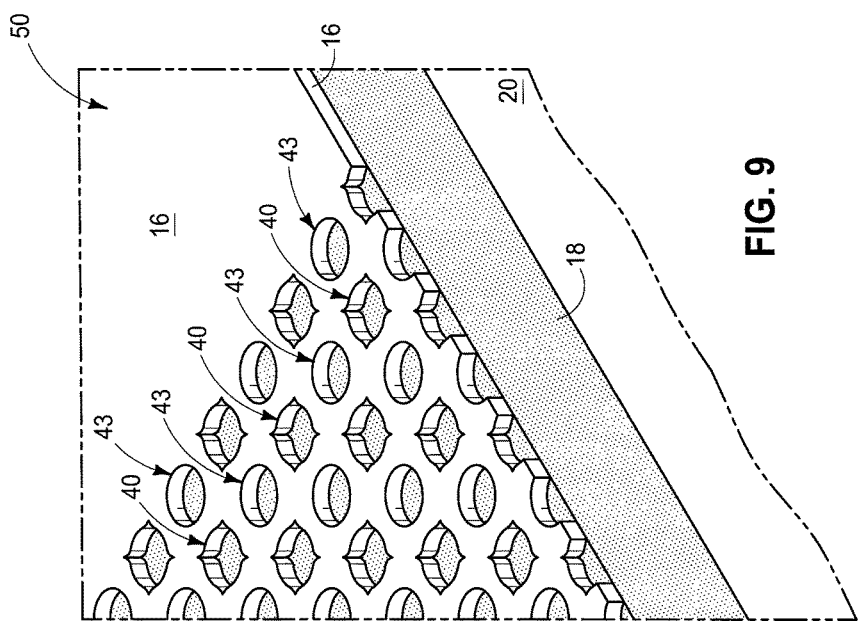

SUBSTRATE MASK PATTERNS, METHODS OF FORMING A STRUCTURE ON A SUBSTRATE, METHODS OF FORMING A SQUARE LATTICE PATTERN FROM AN OBLIQUE LATTICE PATTERN, AND METHODS OF FORMING A PATTERN ON A SUBSTRATE

RELATED PATENT DATA

This application is a divisional of U.S. patent application Ser. No. 13/712,806, which was filed on Dec. 12, 2012, entitled "Substrate Mask Patterns, Methods Of Forming A Structure On A Substrate, Methods Of Forming A Square Lattice Pattern From An Oblique Lattice Pattern, And Methods Of Forming A Pattern On A Substrate", listing Vishal Sipani, Anton J. deVilliers, William R. Brown, Shane J. Trapp, Ranjan Khurana, and Kevin R. Shea as inventors, the disclosure of which is incorporated herein by reference.

TECHNICAL FIELD

Embodiments disclosed herein pertain to substrate mask patterns, to methods of forming a structure on a substrate, to methods of forming a square lattice pattern from an oblique lattice pattern, and to methods of forming a pattern on a substrate.

BACKGROUND

Integrated circuits are often formed on a semiconductor substrate such as a silicon wafer or other semiconductive material. In general, layers of various materials which are semiconductive, conductive, or electrically insulative are used to form the integrated circuits. By way of examples, the various materials may be doped, ion implanted, deposited, etched, grown, etc. using various processes. A continuing goal in semiconductor processing is to strive to reduce the size of individual electronic components, thereby enabling smaller and denser integrated circuitry.

One technique for patterning and processing semiconductor substrates is photolithography. Such may include deposition of a patternable masking layer commonly known as photoresist. Such materials can be processed to modify their solubility in certain solvents, and are thereby readily usable to form patterns on a substrate. For example, portions of a photoresist layer can be exposed to actinic energy through openings in a radiation-patterning tool, such as a mask or reticle, to change the solvent solubility of the exposed regions versus the unexposed regions compared to the solubility in the as-deposited state. Thereafter, the exposed or unexposed regions can be removed, depending on the type of photoresist, to leave a masking pattern of the photoresist on the substrate. Adjacent areas of the underlying substrate next to the masked portions can be processed, for example by etching or ion implanting, to effect the desired processing of the substrate adjacent the masking material. In certain instances, multiple different layers of photoresist and/or a combination of photoresists with non-radiation sensitive masking materials are used. Further, patterns may be formed on substrates without using photoresist.

The continual reduction in feature sizes places ever greater demands on the techniques used to form those features. For example, photolithography is commonly used to form patterned features such as conductive lines and arrays of contact openings to underlying circuitry. A concept commonly referred to as "pitch" can be used to describe the sizes of the repeating features in conjunction with spaces immediately adjacent thereto. Pitch may be defined as the distance between an identical point in two neighboring features of a repeating pattern in a straight-line cross section, thereby including the maximum width of the feature and the space to the next immediately adjacent feature. However, due to factors such as optics and light or radiation wavelength, photolithography techniques tend to have a minimum pitch below which a particular photolithographic technique cannot reliably form features. Thus, minimum pitch of a photolithographic technique is an obstacle to continued feature size reduction using photolithography.

Pitch doubling or pitch multiplication is one proposed method for extending the capabilities of photolithographic techniques beyond their minimum pitch. Such typically forms features narrower than minimum photolithography resolution by depositing one or more spacer-forming layers to have a total lateral thickness which is less than that of the minimum capable photolithographic feature size. The spacer-forming layers are commonly anisotropically etched to form sub-lithographic features, and then the features which were formed at the minimum photolithographic feature size are etched from the substrate.

Using such techniques where pitch is actually halved, the reduction in pitch is conventionally referred to as pitch "doubling". More generally, "pitch multiplication" encompasses increase in pitch of two or more times, and also of fractional values other than integers. Thus conventionally, "multiplication" of pitch by a certain factor actually involves reducing the pitch by that factor.

In addition to minimum feature size and placement of such features, it is often highly desirable that the features as-formed be uniform in dimension. Accordingly, uniformity when forming a plurality of features may also be of concern, and is increasingly a challenge as the minimum feature dimensions reduce.

BRIEF DESCRIPTION OF THE DRAWINGS

FIG. 3 is a view of the FIG. 2 substrate at a processing step subsequent to that shown by FIG. 2.

FIG. 4 is a view of the FIG. 3 substrate at a processing step subsequent to that shown by FIG. 3.

FIG. 7 is a view of the FIG. 6 substrate at a processing step subsequent to that shown by FIG. 6.

FIG. 8 is a view of the FIG. 7 substrate at a processing step subsequent to that shown by FIG. 7.

FIG. 9 is a view of the FIG. 8 substrate at a processing step subsequent to that shown by FIG. 8.

FIG. 10 is a view of the FIG. 9 substrate at a processing step subsequent to that shown by FIG. 9.

DETAILED DESCRIPTION OF EXAMPLE EMBODIMENTS

Embodiments of the inventions encompass substrate mask patterns, methods of forming a structure on a substrate, methods of forming a square lattice pattern from an oblique lattice pattern, and methods of forming a pattern on a substrate. Any method and pattern in accordance with the invention may be used in the fabrication of integrated circuitry or for other purposes, and whether existing or yet-to-be-developed.

Figure 1:
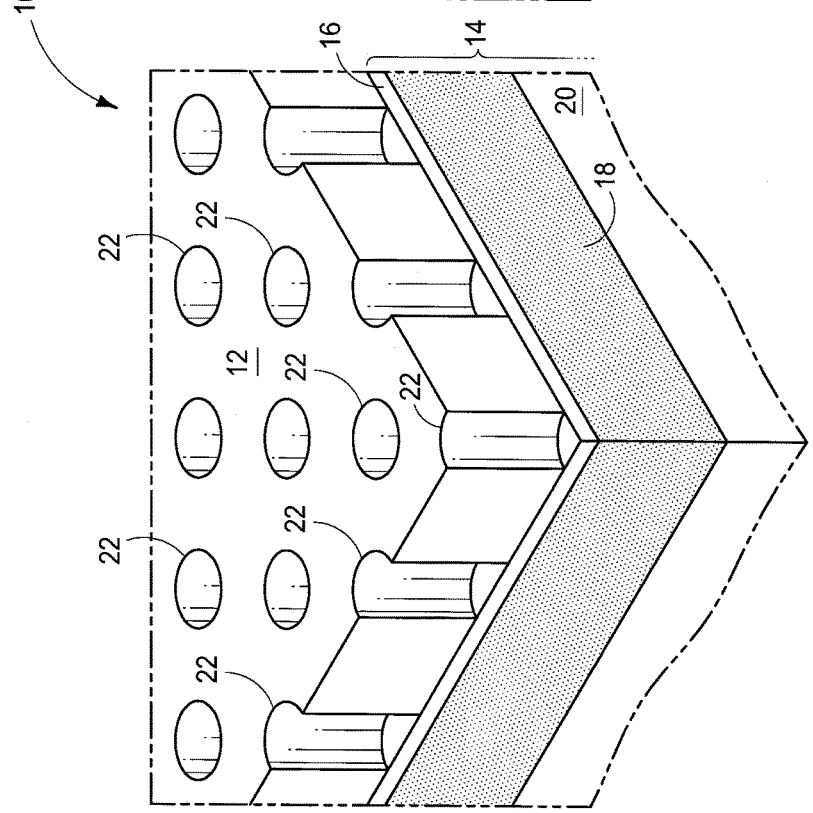
FIG. 1 is a diagrammatic isometric view of a substrate in process in accordance with an embodiment of the invention.

Referring to FIG. 1, a substrate fragment 10 is shown, and may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Example substrate 10 comprises a first material 12 that is elevationally outward of substrate material 14. Any of the materials and/or structures described herein may be homogenous or non-homogenous. Further, each may be formed using any suitable existing or yet-to-be-developed technique (with or without plasma), with atomic layer deposition, chemical vapor deposition, and physical vapor deposition being examples. First material 12 may comprise a masking material, which may be sacrificial, with photoresist being but one example (e.g., negative tone developable photoresist). Example substrate material 14 is shown as comprising materials 16, 18, and 20. As examples, material 16 may be hard-masking and/or antireflective coating material (e.g., $Si_xO_yN_z$). An example material 18 comprises carbon, for example an elevationally outer portion comprising diamond-like carbon and an elevationally inner portion comprising amorphous hard-mask carbon. Material 20, in one example, may be that portion of substrate fragment 10 in which a pattern may be formed from processing relative to materials 12, 16, and 18. Alternately, a pattern may be formed in accordance with some embodiments of the invention with respect to any of materials 12, 16, and/or 18 independent of subsequent processing, if any, relative to an elevationally underlying material 20. Regardless, an example material 20 is doped or undoped silicon dioxide, and one or multiple additional materials may form a part thereof or be therebelow.

An array of openings 22 has been formed in first material 12. In one embodiment, openings 22 extend through first material 12 to substrate material 14. In one embodiment, openings 22 are formed in an oblique lattice pattern, for example as-shown. Example manners of forming openings 22 include photolithographic patterning and/or etch, for example with openings 22 being formed at a minimum-photolithographic-capable feature dimension. Alternately, openings 22 may be formed at greater than a minimum-photolithographic-capable feature dimension, or may be formed to be sub-resolution (e.g., being sub-lithographic such as being formed using pitch multiplication techniques).

Figure 2:
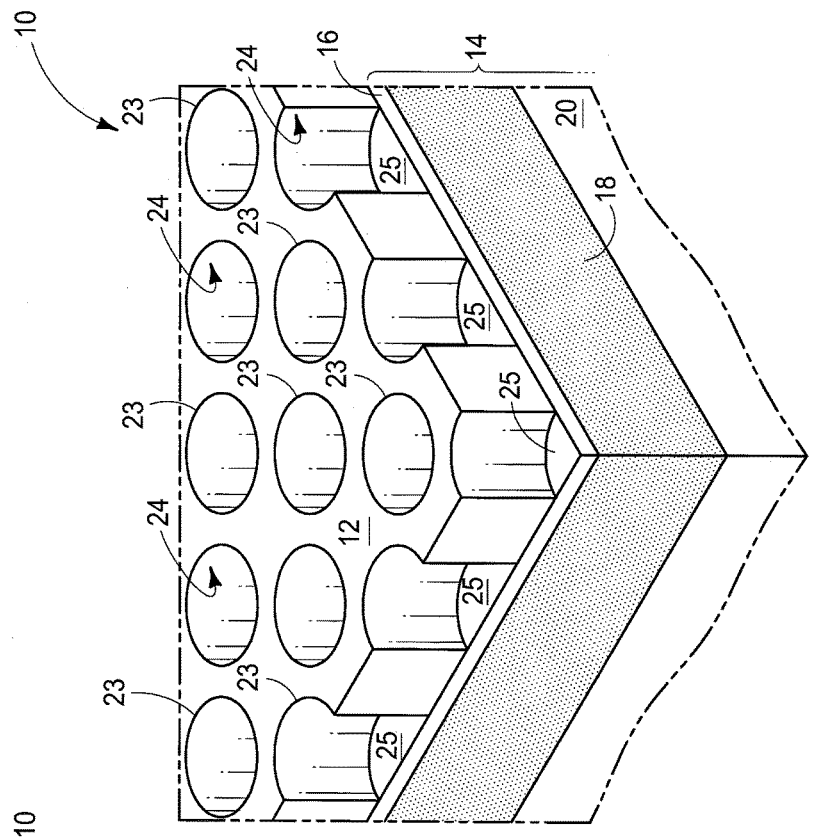
FIG. 2 is a view of the FIG. 1 substrate at a processing step subsequent to that shown by FIG. 1.

Referring to FIG. 2, former openings 22 (not shown) have been widened to form widened openings 23. Such may be conducted by an isotropic etch which removes material approximately equally from the sides and top of first material 12. Alternately, chemistry and conditions may be used which tend to etch greater material from the lateral sides of first material 12 that from the top. Alternately, chemistries and conditions may be used which tend to etch greater material from the top of first material 12 than from the lateral sides. For example, isotropic etching may be conducted within an inductively coupled reactor. Example etching parameters which will achieve essentially isotropic etching where first material 12 is photoresist and/or other organic-comprising material are pressure from about 2 mTorr to about 50 mTorr, substrate temperature from about 0° C. to about 110° C., source power from about 150 watts to about 500 watts, and bias voltage at less than or equal to about 25 volts. An example etching gas is a combination of $Cl_2$ from about 20 sccm to about 100 sccm and $O_2$ from about 10 sccm to about 50 sccm. Where first material 12 comprises photoresist, such will isotropically etch at a rate from about 0.2 nanometers per second to about 3 nanometers per second. If even more lateral etching is desired in comparison to vertical etching, example parameter ranges in an inductively coupled reactor include pressure from about 2 mTorr to about 20 mTorr, source power from about 150 watts to about 500 watts, bias voltage at less than or equal to about 25 volts, substrate temperature of from about 0° C. to about 110° C., $Cl_2$ and/or HBr flow from about 20 sccm to about 100 sccm, $O_2$ flow from about 5 sccm to about 20 sccm, and $CF_4$ flow from about 80 sccm to about 120 sccm. Regardless, widened openings 23 may be considered as comprising sidewalls 24 and bases 25.

Referring to FIG. 3, a second material 26 has been formed elevationally over first material 12 and to line sidewalls 24 and bases 25 of widened openings 23. In one embodiment, second material 26 is formed to have a lateral thickness which is sub-resolution (i.e., to have a thickness that is less than the minimum feature size fabricated on the substrate fragment solely using photolithographic techniques). Regardless, second material 26 is of different composition from that of first material 12, with silicon dioxide being an example where first material 12 comprises photoresist. As used herein, "different composition" only requires those portions of two stated materials that may be directly against one another to be chemically and/or physically different, for example if such materials are not homogenous. If the two stated materials are not directly against one another, "different composition" only requires that those portions of the two stated materials that are closest to one another be chemically and/or physically different if such materials are not homogenous. In this document, a material or structure is "directly against" another when there is at least some physical touching contact of the stated materials or structures relative one another. In contrast, "over", "on", and "against" not preceded by "directly", encompass "directly against" as well as construction where intervening material(s) or structure(s) result(s) in no physical touching contact of the stated materials or structures relative one another.

Referring to FIG. 4, second material 26 has been removed back at least to first material 12 to form an upwardly-open cylinder-like structure 28 comprising second material 26 within individual of widened openings 23. In one embodiment, cylinder-like structures 28 are formed by maskless (i.e., no mask being received over material 26 at least within an array area within which openings 23 were formed) anisotropic spacer etching of material 26 whereby material 26 is also removed centrally from over opening bases 25.

Figures 5, 6:
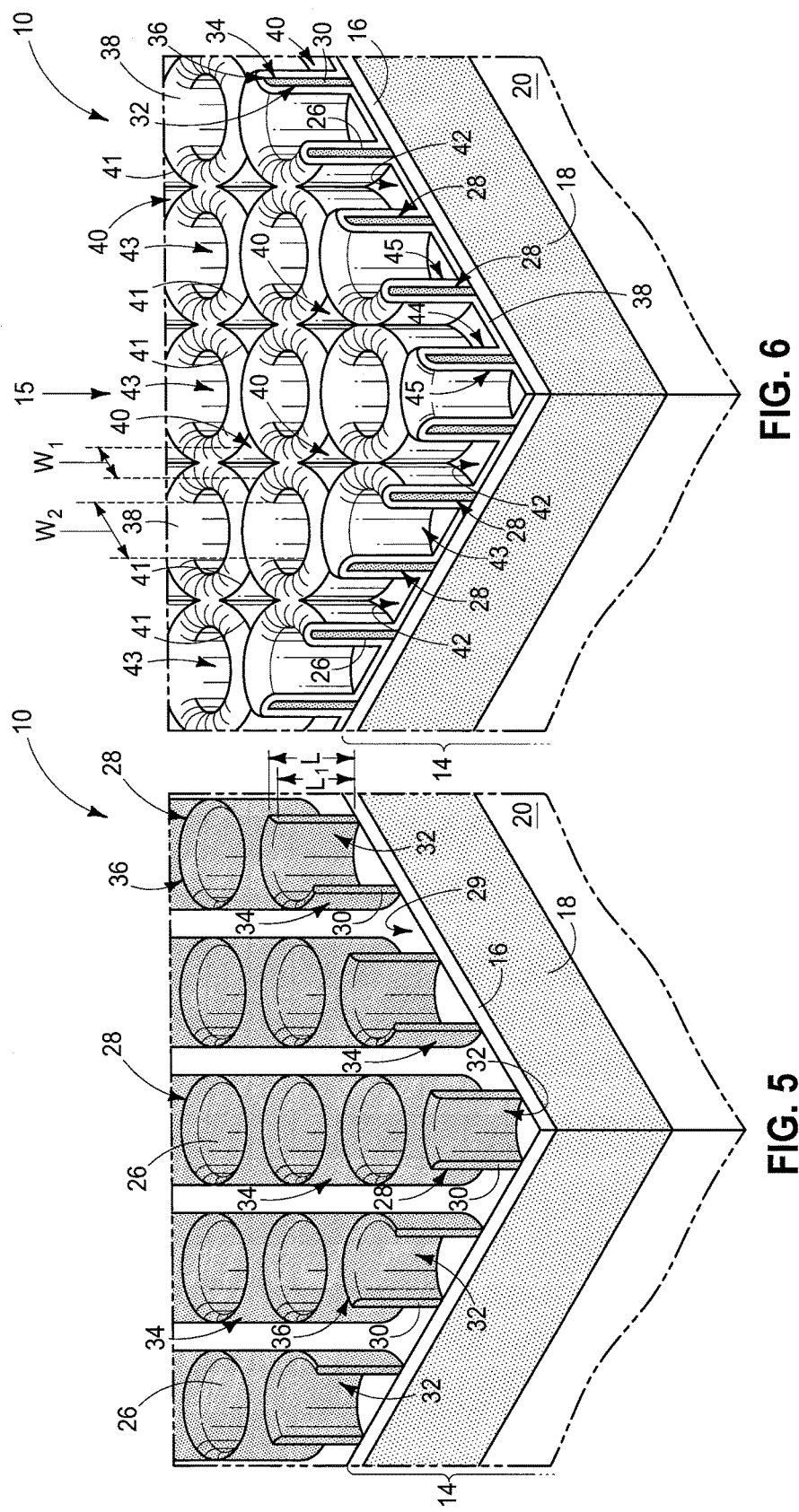
FIG. 5 is a view of the FIG. 4 substrate at a processing step subsequent to that shown by FIG. 4.
FIG. 6 is a view of the FIG. 5 substrate at a processing step subsequent to that shown by FIG. 5.

Referring to FIG. 5, first material 12 (not shown) has been removed selectively relative to cylinder-like structures 28. In this document, a "selective" removal requires removal of one material relative to another stated material at a rate of at least 2:1. An example technique for doing so where second material 26 comprises silicon dioxide and first material 12 comprises photoresist is ashing in an oxygen-containing environment. In one embodiment, all of first material 12 is removed (as shown) and in another embodiment only some of first material 12 is removed (not shown).

The above processing describes but one method of forming spaced upwardly-open cylinder-like structures which project longitudinally outward of a base, for example a base 14. Any alternate technique may be used. Example cylinder-like structures 28 may be considered as comprising walls 30 having laterally inner sidewalls 32, laterally outer sidewalls 34, and tops 36. In one embodiment, cylinder-like structures 28 are formed to be longitudinally longer than widest lateral thickness of their walls 30, for example as shown. Cylinder-like structures 28 may be ring-like, for example not being significantly longitudinally elongated. In one embodiment, cylinder-like structures 28 have variable lateral wall thickness along their respective longitudinal lengths, for example lengths "L" as shown. In one embodiment and as shown, walls 30 of cylinder-like structures 28 are narrowest longitudinally furthest from base 14. In one embodiment and as shown, walls 30 curve laterally outward longitudinally-furthest from base 14. In one embodiment and as shown, cylinder-like structures 28 have constant lateral wall thickness along a majority of their respective longitudinal lengths L, for example along the depicted lengths $L_1$. Lengths L and/or lengths $L_1$ may be the same for all structures 28 or may be different for some structures 28.

Referring to FIG. 6, tops 36, inner sidewalls 32, and outer sidewalls 34 of cylinder-like structures 28 have been lined with spacer material 38 which longitudinally contacts with itself (e.g., pinches-off) to form interstitial spaces 40 laterally outward of cylinder-like structures 28. Interstitial spaces 40 are individually surrounded by the longitudinally-contacting spacer material 38 that is over outer sidewalls 34 of four cylinder-like structures 28. In one embodiment and as shown, interstitial spaces 40 individually comprise bases 42 of spacer material 38 that are elevationally over substrate material 14. In one embodiment, spacer material 38 and second material 26 of cylinder-like structures 28 are of different compositions. Alternately as an example, spacer material 38 and second material 26 are of the same composition.

The above describes but one example processing of forming a sidewall lining 45 over inner sidewalls 32 and a sidewall lining 44 over outer sidewalls 34 of cylinder-like structures 28. Linings 44 and 45 may be considered as sidewall spacers. Regardless, outer sidewall linings 44 form interstitial spaces 40 laterally outward of cylinder-like structures 28, with such interstitial spaces being individually surrounded by longitudinally-contacting sidewall linings 44 that are over outer sidewalls 34 of four of the cylinder-like structures 28. In one embodiment, interstitial spaces 40 are individually of quadrilateral cross-sectional shape having concave sidewalls 41, and in one embodiment as shown are individually of rectangular cross-sectional shape. The example processing has also formed openings 43 laterally inward of cylinder-like structures 28, which in one embodiment are lined by material 38 of inner sidewall linings 45. In one embodiment and as shown, the openings of cylinder-like structures 28 form a prior oblique lattice pattern and openings 43 in combination with interstitial spaces 40 form a later square lattice pattern. Regardless, in one embodiment, the interstitial spaces have respective shorter minimum open dimensions at an elevationally outermost surface of the sidewall linings (e.g., $W_1$ in FIG. 6) than those of openings 43 (e.g., $W_2$).

In one embodiment and as shown, cylinder-like structures 28 are formed in openings in first/masking material 12 prior to forming sidewall linings 44, 45. In one embodiment, those openings are widened prior to forming the sidewall linings, and in one embodiment the first/masking material is removed prior to forming the sidewall linings. Sidewall linings 44, 45 may be of the same composition or different compositions from that of cylinder-like structures 28.

In one embodiment, material 38 of linings 44, 45 is at least initially formed elevationally over elevationally outermost edges of cylinder-like structures 28 (i.e., over tops 36). In one embodiment, material 38 of linings 44, 45 is removed from being elevationally over the elevationally outmost edges/tops of the cylinder-like structures. In one embodiment, material 38 is removed from being over bases 42 of interstitial spaces 40, and in one embodiment to extend interstitial spaces 40 to substrate material 14, for example as shown in FIG. 7. In one embodiment where anisotropic etching is used to form the structure of FIG. 7, such etching may be maskless (i.e., no mask being received at least over an array area in which lined cylinder-like structures 28 are received).

The above shown and described processing are but example methods of forming a pattern on a substrate, for example a pattern 15 as shown in FIG. 6 and/or a pattern 17 as shown in FIG. 7. Accordingly, processing in accordance with some embodiments of the invention may be completed at either the processing shown by FIG. 6 or the processing shown by FIG. 7. Alternately or additionally, subsequent processing may occur, for example using the pattern of FIG. 6 and/or the pattern of FIG. 7 to process substrate material 14 in the fabrication of integrated circuitry or for other purposes.

Regardless, an embodiment of the invention includes a substrate mask pattern which comprises spaced upwardly-open, cylinder-like structures that project longitudinally outward of a base over which the mask pattern lies. Sidewall spacers are over inner and outer sidewalls of the cylinder-like structures that form interstitial spaces laterally outward of the cylinder-like structures. The interstitial spaces are individually surrounded by longitudinally-contacting sidewall spacers that are over outer sidewalls of four of the cylinder-like structures. The structures of FIG. 6 and FIG. 7 are examples of such substrate mask patterns, and independent of method of fabrication. Any other structural attribute as described above may be used in a substrate mask pattern as-just described in accordance with embodiments of the invention.

An embodiment of the invention includes a method of forming a structure on a substrate that includes forming an opening into a substrate. A first anisotropically etched sidewall spacer is formed about laterally internal sidewalls of the opening. Material into which the opening was formed is removed to leave the first anisotropically etched sidewall spacer as an upwardly-open, cylinder-like structure projecting longitudinally outward relative to an elevationally outer surface of the substrate. Second anisotropically etched sidewall spacers are formed over laterally inner and outer sidewalls of the cylinder-like structure. Processing and any other attribute as described above may be used.

Some embodiments of the invention also include a method of forming a square lattice pattern from an oblique lattice pattern. In some embodiments, inner and outer sidewalls of upwardly open cylinder-like structures that are in an oblique lattice pattern are lined with material that longitudinally contacts with itself to form interstitial spaces laterally outward of the cylinder-like structures. The interstitial spaces are individually surrounded by the longitudinally-contacting material that is over outer sidewalls of four of the cylinder-like structures. The lined cylinder-like structures and spaces collectively form a square lattice pattern of openings. In some embodiments, the square lattice pattern may be used in the fabrication of integrated circuitry. Any other above-described attribute may be used.

The pattern of FIG. 6 or the pattern of FIG. 7 may be used in processing underlying substrate material, for example as a mask for ion implanting, diffusion doping, or etching into base 14. Regardless, if desired, an optional cut masking and etching step may be performed to remove cylinder-like structures 28 and lining material 38 from the area outside of an array or other target area of interest.

In one embodiment, cylinder-like structures 28 and sidewall linings 44, 45 are used as an etch mask while etching into base 14, for example as shown in FIG. 8. In one embodiment, an outer portion of base 14 comprises a hard-masking material, for example material 16. In one embodiment, an etch mask 50 is formed in hard-masking material 16. An example cut masking and etching step was previously conducted with respect to certain lined cylinder-like structures 28, and a patterned masking material 48 has been subsequently formed there-over. Lined cylinder-like structures 28 of FIG. 7 have subsequently been used as masking in etching through a hard-masking material 16, and in one embodiment selectively relative to material 18. Some of material 26 and/or 38 may be removed, for example as shown.

Referring to FIG. 9, cylinder-like structures 28 (not shown) and sidewall linings 44, 45 (not shown) have been removed from being over hard-masking material 16, leaving remnant openings 40 and 43 in material 16. The above described processing may have a tendency to round-out openings 40 which are transferred into hard-masking material 16, for example as shown.

Referring to FIG. 10, hard-masking material 16 has been used as an etch mask while etching into material 18 and/or 20 that is elevationally inward of material 16. The openings formed in substrate material 18/20 may be used as contact openings, capacitor electrode openings, and/or for forming programmable portions of two-electrode memory cells, by way of examples only.

Figure 11:
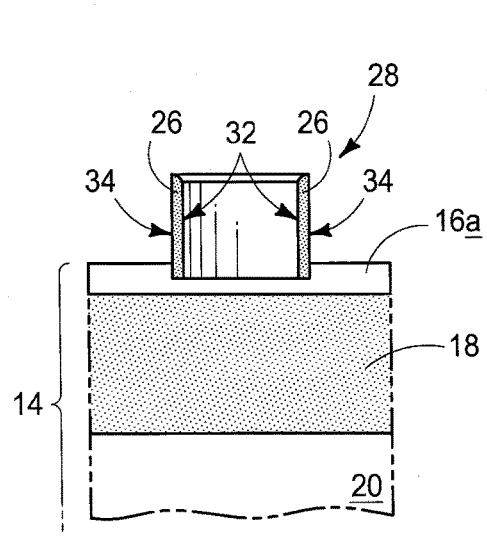
FIG. 11 is a diagrammatic sectional view of a substrate in process in accordance with an embodiment of the invention.

In the above example embodiment of FIG. 5, substrate material 16 may be of different composition from that of cylinder-like structures 28, and cylinder-like structures 28 lie upon an elevationally outermost surface 29 (which in one embodiment is planar) of material 16. Alternate embodiments are contemplated. For example, a portion of an alternate substrate fragment 10a in accordance with an embodiment of the invention is shown in FIG. 11. Like numerals from the above-described embodiments have been used where appropriate, with some construction differences being indicated with the suffix "a" or with different numerals. FIG. 11 is a cross-sectional view of a single cylinder-like structure 28 in processing sequence corresponding to that of FIG. 5. In FIG. 11, elevationally outermost material of base 14 (e.g., material of structure 16a) is of different composition from that of elevationally innermost material of cylinder-like structure 28, and cylinder-like structure 28 extends elevationally into elevationally outermost material 16a. Such may provide a desired effect of better anchoring cylinder-like structures 28 relative to base substrate 14 than occurs in the example depicted embodiment of FIG. 5 wherein cylinder-like structures 28 lie atop material 16 as opposed to being at least partially-embedded therein as in FIG. 11.

Figure 12:
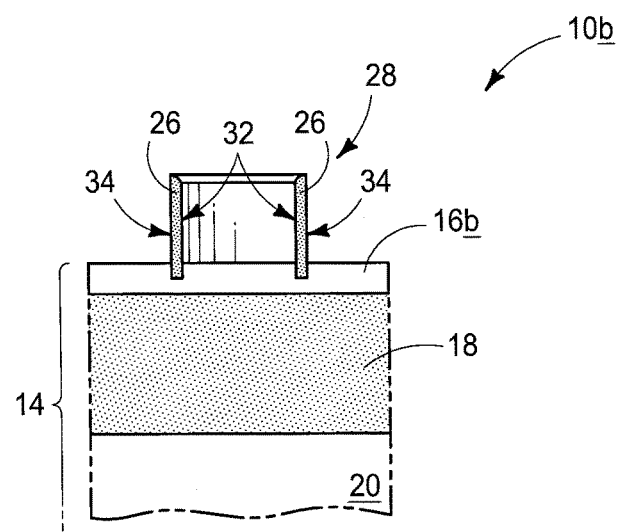
FIG. 12 is a diagrammatic sectional view of a substrate in process in accordance with an embodiment of the invention.
Figure 13:
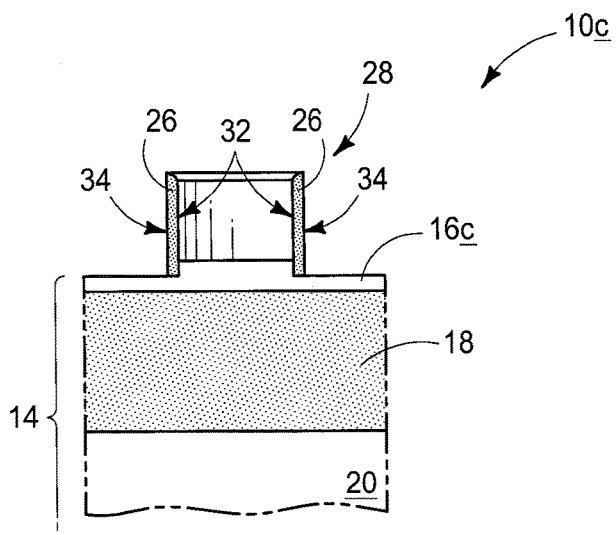
FIG. 13 is a diagrammatic sectional view of a substrate in process in accordance with an embodiment of the invention.

FIG. 11 shows an example embodiment substrate 10a wherein material 16a of base 14 is directly against laterally outermost sidewalls 34 of cylinder-like structures 28, and in one embodiment as shown is not directly against laterally innermost sidewalls 32 of cylinder-like structures 28. FIGS. 12 and 13 show example alternate embodiment substrates 10b and 10c, respectively, to that of FIG. 11. Like numerals from the above described embodiments have been used where appropriate, with some construction differences being indicated with the suffix "b" and "c", respectively. FIGS. 12 and 13 each show an example embodiment where material 16b or 16c of base 14 is directly against laterally innermost sidewalls 32 of cylinder-like structures 28. FIG. 13 is an example embodiment where material 16c is not directly against laterally outermost sidewalls 34 of cylinder-like structures 28. FIG. 12 is an example embodiment where material 16b is directly against laterally outermost sidewalls 34.

The structures of FIGS. 11, 12, and 13 may be fabricated using any suitable technique, as will be appreciated by the artisan. For example with respect to FIG. 11, a carbon-containing material and a $Si_xO_yN_z$ could be provided between material 16 and material 12 in FIG. 2. Material 12 and/or the $Si_xO_yN_z$ material could then be used as an etch mask while etching through the carbon-containing material and partially into the $Si_xO_yN_z$ material. The subsequently formed cylinder-like structures would thereby be anchored in material 16a as shown in FIG. 11.

CONCLUSION

In some embodiments, a method of forming a pattern on a substrate comprises forming spaced, upwardly-open, cylinder-like structures projecting longitudinally outward of a base. A sidewall lining is formed over inner and over outer sidewalls of the cylinder-like structures, and that forms interstitial spaces laterally outward of the cylinder-like structures. The interstitial spaces are individually surrounded by longitudinally-contacting sidewall linings that are over outer sidewalls of four of the cylinder-like structures.

In some embodiments, a method of forming a structure on a substrate comprises forming an opening into a substrate. A first anisotropically etched sidewall spacer is formed about laterally internal sidewalls of the opening. Material into which the opening was formed is removed to leave the first anisotropically etched sidewall spacer as an upwardly-open, cylinder-like structure projecting longitudinally outward relative to an elevationally outer surface of the substrate. Second anisotropically etched sidewall spacers are formed over laterally inner and outer sidewalls of the cylinder-like structure.

In some embodiments, a method of forming a square lattice pattern from an oblique lattice pattern comprises lining inner and outer sidewalls of upwardly-open, cylinder-like structures that are in an oblique lattice pattern with material that longitudinally contacts with itself to form interstitial spaces laterally outward of the cylinder-like structures. The interstitial spaces are individually surrounded by the longitudinally-contacting material that is over outer sidewalls of four of the cylinder-like structures.

The lined cylinder-like structures and spaces collectively form a square lattice pattern of openings.

In some embodiments, a method of forming a pattern on a substrate comprises forming an array of openings in first material that is elevationally outward of substrate material. After forming the openings, they are widened. Second material is formed elevationally over the first material and to line sidewalls and bases of the widened openings. The second material is of different composition from that of the first material. The second material is removed back at least to the first material to form an upwardly-open cylinder-like structure comprising the second material within individual of the widened openings. The first material is removed selectively relative to the cylinder-like structures. Tops, inner sidewalls, and outer sidewalls of the cylinder-like structures are lined with spacer material that longitudinally contacts with itself to form interstitial spaces laterally outward of the cylinder-like structures. The interstitial spaces are individually surrounded by the longitudinally-contacting spacer material that is over outer sidewalls of four of the cylinder-like structures. The interstitial spaces individually comprise bases of spacer material that is elevationally over the substrate material. The spacer material is removed from the tops of the cylinder-like structures and from the bases of the interstitial spaces to extend the interstitial spaces to the substrate material.

In some embodiments, a substrate mask pattern comprises spaced, upwardly-open, cylinder-like structures that project longitudinally outward of a base over which the mask pattern lies. Sidewall spacers are over inner and outer sidewalls of the cylinder-like structures and that form interstitial spaces laterally outward of the cylinder-like structures. The interstitial spaces are individually surrounded by longitudinally-contacting sidewall spacers that are over outer sidewalls of four of the cylinder-like structures.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A substrate mask pattern comprising:
   cylinder-like structures projecting longitudinally outward of a base over which the mask pattern lies, the cylinder-like structures being spaced from one another and individually comprising an upwardly-open cylinder-like chamber; and
   sidewall spacers over inner and outer sidewalls of the cylinder-like structures that form interstitial spaces laterally outward of the cylinder-like structures, the interstitial spaces being spaced from one another and individually surrounded by sidewall spacers that are over outer sidewalls of four different of the cylinder-like structures and contact one another along a majority of their longitudinal lengths.

2. The substrate mask of claim 1 wherein the cylinder-like structures are within openings in masking material.

3. The substrate mask of claim 1 wherein the cylinder-like structures are longitudinally longer than widest lateral thickness of their walls.

4. The substrate mask of claim 1 wherein the base comprises an elevationally outermost material of different composition from that of elevationally innermost material of the cylinder-like structures, the cylinder-like structures lying upon an elevationally outermost surface of the elevationally outermost material.

5. The substrate mask of claim 1 wherein the sidewall spacers are of the same composition as that of the cylinder-like structures.

6. The substrate mask of claim 1 wherein the sidewall spacers are of different composition from that of the cylinder-like structures.

7. The substrate mask of claim 1 wherein the sidewall spacers over the inner sidewalls form openings laterally inward of the cylinder-like structures, the interstitial spaces having respective shorter minimum open dimensions at an elevationally outermost surface of the sidewall spacers than those of the openings.

8. The substrate mask of claim 1 wherein the interstitial spaces are individually of quadrilateral cross-sectional shape with concave sidewalls.

9. The substrate mask of claim 8 wherein the interstitial spaces are individually of rectangular cross-sectional shape.

10. The substrate mask of claim 1 wherein the cylinder-like structures are in an oblique lattice pattern.

11. The substrate mask of claim 10 wherein the cylinder-like structures plus the sidewall spacers there-over and the spaces collectively form a square lattice pattern of openings.

12. The substrate mask of claim 1 wherein the cylinder-like structures have variable lateral wall thickness along their longitudinal lengths.

13. The substrate mask of claim 12 wherein the cylinder-like structures have constant lateral wall thickness along the majority of their longitudinal lengths.

14. The substrate mask of claim 12 wherein the walls of the cylinder-like structures are narrowest longitudinally-furthest from the base.

15. The substrate mask of claim 12 wherein the walls curve laterally outward longitudinally-furthest from the base.

16. The substrate mask of claim 1 wherein the base comprises an elevationally outermost material of different composition from that of elevationally innermost material of the cylinder-like structures, the cylinder-like structures extending elevationally into the elevationally outermost material.

17. The substrate mask of claim 16 wherein the elevationally outermost material of the base is directly against laterally innermost sidewalls of the cylinder-like structures.

18. The substrate mask of claim 16 wherein the elevationally outermost material of the base is not directly against laterally outermost sidewalls of the cylinder-like structures.

19. The substrate mask of claim 16 wherein the elevationally outermost material of the base is directly against laterally outermost sidewalls of the cylinder-like structures.

20. The substrate mask of claim 19 wherein the elevationally outermost material of the base is not directly against laterally innermost sidewalls of the cylinder-like structures.

21. The substrate mask of claim 19 wherein the elevationally outermost material of the base is directly against laterally innermost sidewalls of the cylinder-like structures.

* * * * *